(12) United States Patent
Wu et al.

(10) Patent No.: US 11,942,541 B2
(45) Date of Patent: Mar. 26, 2024

(54) SEMICONDUCTOR DEVICE AND METHOD FOR FORMING THE SAME

(71) Applicant: TAIWAN SEMICONDUCTOR MANUFACTURING COMPANY LTD., Hsinchu (TW)

(72) Inventors: Hong-Shyang Wu, Taipei (TW); Kuo-Ming Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 18 days.

(21) Appl. No.: 17/461,855

(22) Filed: Aug. 30, 2021

(65) Prior Publication Data
US 2023/0061900 A1    Mar. 2, 2023

(51) Int. Cl.
*H01L 29/78* (2006.01)
*H01L 29/08* (2006.01)
*H01L 29/66* (2006.01)

(52) U.S. Cl.
CPC ...... *H01L 29/7816* (2013.01); *H01L 29/0873* (2013.01); *H01L 29/6656* (2013.01); *H01L 29/66689* (2013.01)

(58) Field of Classification Search
CPC ............ H01L 29/7816; H01L 29/0873; H01L 29/6656; H01L 29/66689
See application file for complete search history.

(56) References Cited

U.S. PATENT DOCUMENTS

| 2015/0123199 A1* | 5/2015 | Chen | H01L 29/7816 438/286 |
| 2019/0288066 A1* | 9/2019 | Lee | H01L 21/26586 |
| 2022/0149186 A1* | 5/2022 | Edwards | H01L 29/402 |

* cited by examiner

*Primary Examiner* — Mohammed R Alam
(74) *Attorney, Agent, or Firm* — WPAT LAW; Anthony King

(57) ABSTRACT

A semiconductor device including a substrate, a source region, a drain region, a first gate structure and a second gate structure is provided. The source region and a drain region are formed in the substrate. The first gate structure is formed on the substrate and adjacent to the source region. The second gate structure is formed on the substrate and adjacent to the drain region. The second gate structure is electrically coupled to the drain region.

20 Claims, 11 Drawing Sheets

SEMICONDUCTOR DEVICE AND METHOD FOR FORMING THE SAME

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. As semiconductor devices are scaled down, new techniques are needed to maintain the electronic components' performance from one generation to the next. For example, transistors with high breakdown voltage or reduced on-resistance (Ron) are desirable for high power applications.

Metal-oxide-semiconductor field effect transistors (MOSFETs) are adapted for high voltage applications. When a control voltage applied to a gate of a MOSFET is greater than the threshold of the MOSFET, current flows between the drain and the source of the MOSFET. On the other hand, when the control voltage is less than the threshold of the MOSFET, the MOSFET is turned off accordingly. It is desirable to develop MOSFETs with high breakdown voltage or reduced on-resistance (Ron), especially for advanced technologies.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
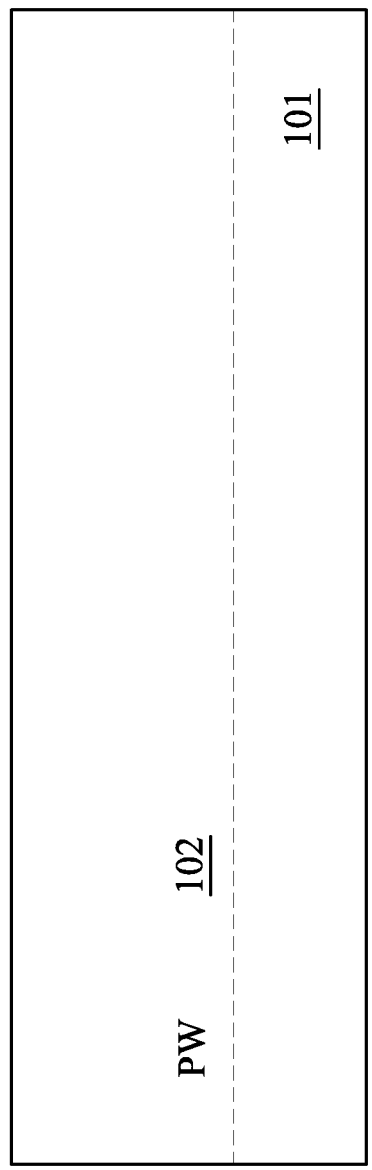
FIGS. 1-8 are diagrams illustrating a high voltage semiconductor device at various stages of fabrication according to an exemplary embodiment of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

In order to sustain high voltage, attempts have been made to improve metal-oxide-semiconductor field effect transistors (MOSFETs), including the use of a stepped gate oxide, a protective oxide layer, split gate, etc. The process for fabricating a stepped gate oxide may require extra thermal operation(s) and extra mask(s) so as to form one or more oxide layer(s) overlying the original gate oxide, which may increase the manufacture time and cost. In some embodiments, a protective oxide layer is formed to cover a top surface of the gate, a gate sidewall spacer and a portion of the drain region. Such embodiments may involve large device pitch (i.e., spacing between half drain contact and half source contact) and the quality of the protective oxide layer may be an issue. In some other embodiments, a split gate is formed adjacent to a main gate and coupled to the ground. The split gate oxide is thicker than the main gate oxide so that it can function as a field oxide. Similarly, to form a thick split gate oxide, extra thermal operation(s) may be needed, which is unfavorable to advanced techniques.

The present disclosure therefore provides a high voltage semiconductor device, e.g., a high voltage MOSFET. In some embodiments, the present disclosure provides a lateral diffused metal-oxide-semiconductor (LDMOS) field effect transistors that can sustain high voltage. The semiconductor device according to the present disclosure includes two gate structure, one of which is adjacent to and electrically coupled to a drain region. The semiconductor device according to the present disclosure exhibits advantages including an enhanced breakdown voltage, a reduced gate-induced drain leakage, a reduced on-resistance (Ron) etc, can sustain a higher voltage and can be fabricated with a reduced device pitch. The drain region is self-aligned to a sidewall spacer of an adjacent gate structure and there is no specific limit to the thickness of the gate oxide of the adjacent gate structure. Thus, semiconductor device according to the present disclosure can be applied to advanced techniques for, e.g., N40 to N5 or below and can be fabricated without extra thermal process or mask and with low manufacture cost.

FIGS. 1 to 8 are diagrams illustrating a high voltage semiconductor device 100 at various stages of fabrication according to an exemplary embodiment of the present disclosure. It is noted that FIGS. 1 to 8 have been simplified for a better understanding of the disclosed embodiment. The high voltage semiconductor device 100 may be configured as a system-on-chip (SoC) device having various PMOS and/or NMOS transistors that are fabricated to operate at different voltage levels. The PMOS and/or NMOS transistors may provide low voltage functionality including logic/memory devices and input/output devices, and high voltage functionality including power management devices. It is understood that the high voltage semiconductor device 100 may also include resistors, capacitors, inductors, diodes, and other suitable microelectronic devices that are typically implemented in integrated circuits. Although in the embodiment of FIGS. 1-8 the high voltage semiconductor device 100 including an n-type high voltage MOS (NHVMOS) device is illustrated, the present disclosure may also be applied to a variety of MOS devices. The operations shown in FIGS. 1 to 8 are also reflected schematically in the flowchart shown in FIG. 11. It should be noted that the operations for forming the semiconductor device 100 may be rearranged or otherwise modified within the scope of the various aspects.

Referring to FIG. 1, a semiconductor substrate 101 is provided. The substrate 101 may include a semiconductor wafer such as a silicon wafer. Alternatively, the substrate 101 may include other elementary semiconductors such as germanium. The substrate 101 may also include a compound semiconductor such as silicon carbide, gallium arsenic, indium arsenide, and indium phosphide. Moreover, the substrate 101 may include an alloy semiconductor such as silicon germanium, silicon germanium carbide, gallium arsenic phosphide, and gallium indium phosphide. In an embodiment, the substrate 101 includes an epitaxial layer (epi layer) overlying a bulk semiconductor. Furthermore, the substrate 101 may include a semiconductor-on-insulator (SOI) structure. For example, the substrate 101 may include a buried oxide (BOX) layer formed by a process such as separation by implanted oxygen (SIMOX). In various embodiments, the substrate 101 may include a buried layer such as an n-type buried layer (NBL), a p-type buried layer (PBL), and/or a buried dielectric layer including a buried oxide (BOX) layer. In the present embodiment, illustrated as an n-type HVMOS, the substrate 101 includes a p-type silicon substrate (p-substrate). To form a complementary HVMOS, an n-type buried layer, i.e., deep n-well (DNW), may be implanted deeply under the active region of the p-type HVMOS of the p-substrate 101.

As shown in FIG. 1, a P-well (PW) 102 is formed in various regions of the P-substrate 101 by ion-implantation or diffusion techniques known in the art. In some embodiments, a patterned photoresist layer (not shown) is formed in a photolithography process or other suitable process. An exemplary photolithography process may include processing steps of photoresist coating, soft baking, mask aligning, exposing, post-exposure baking, developing, and hard baking. The patterned photoresist layer defines the regions for forming the P-well. Then, an ion implantation utilizing a p-type dopant, such as boron, may be performed to form the P-well 102 in the regions.

Figure 2:
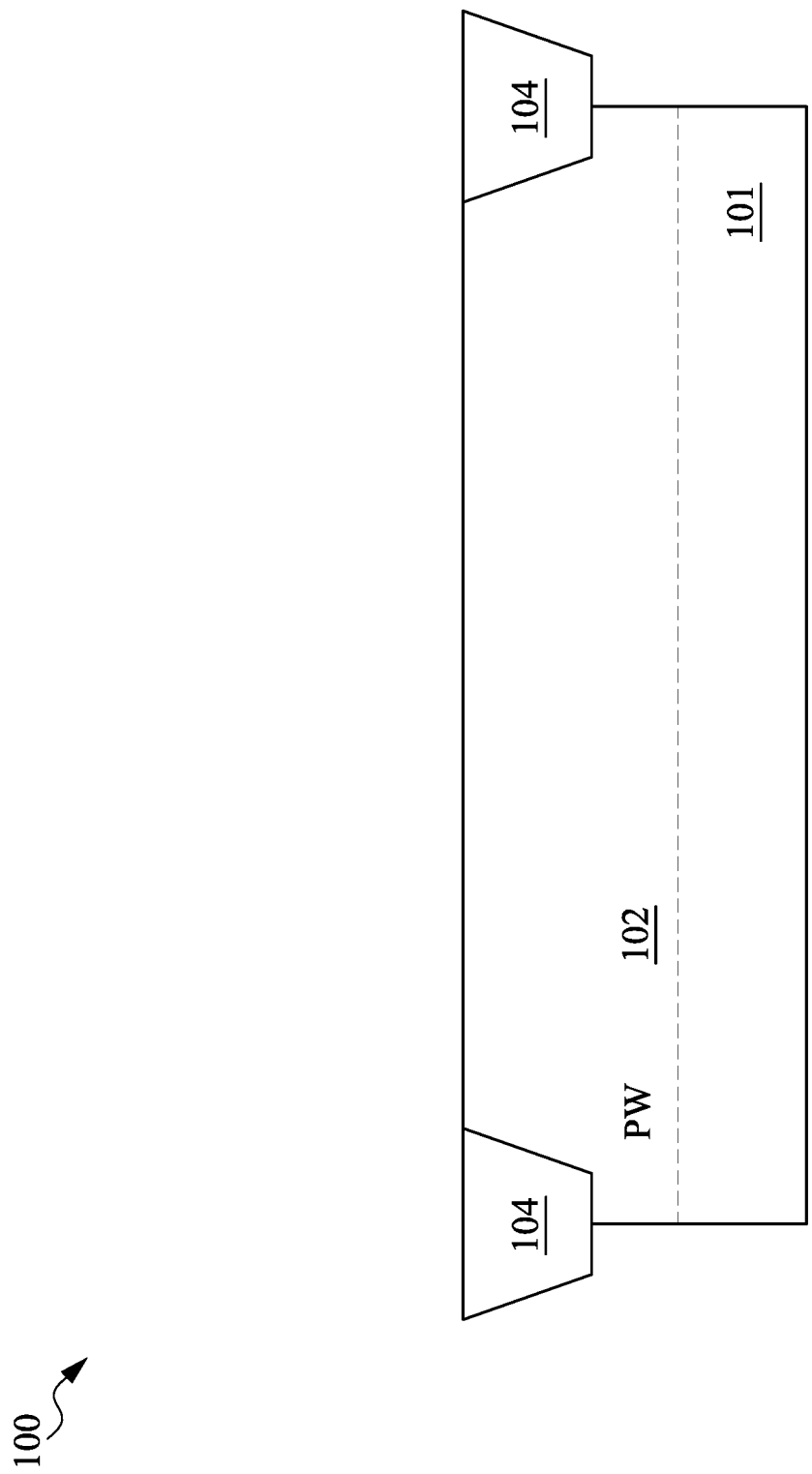

Referring to FIG. 2, isolation feature structures 104 such as shallow trench isolations (STI) or local oxidation of silicon (LOCOS) including isolation features may be formed in the substrate 101 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 3:
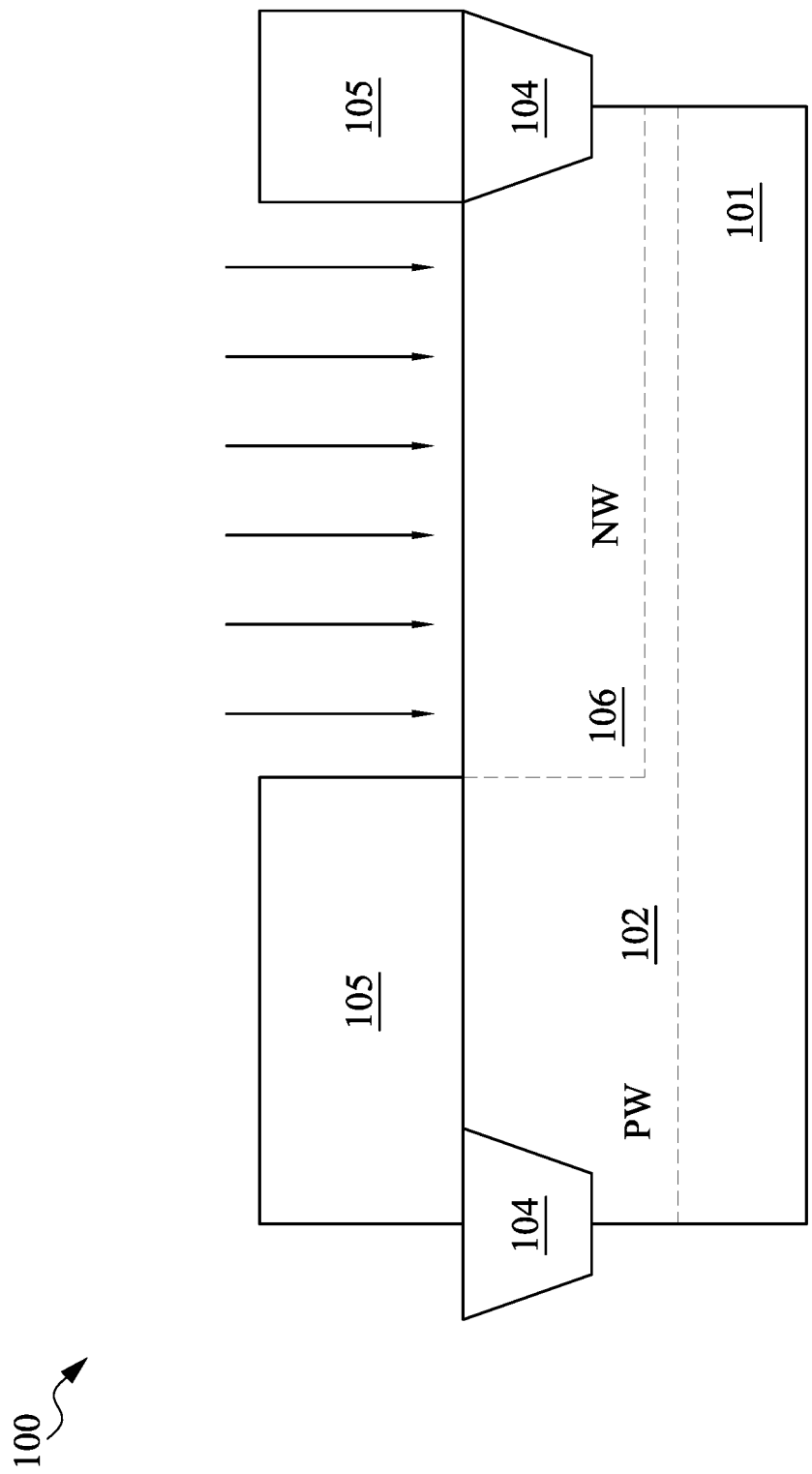

Referring to FIG. 3, an N-well (NW) 106 is formed in various regions of the P-substrate 101 by ion-implantation or diffusion techniques known in the art. The N-well 106 may be formed in a similar manner as discussed above for the P-well 102. An N-well mask (not shown) is used to from a patterned photoresist layer 105 in a photolithography process or other suitable process. An exemplary photolithography process may include processing steps of photoresist coating, soft baking, mask aligning, exposing, post-exposure baking, developing, and hard baking. An ion implantation utilizing an n-type dopant, such as arsenic or phosphorus, may be performed to form the N-well (NW) 106 in the substrate 101. The N-well 106 may be referred to as an extended drain of the NHVMOS device.

It is noted that other ion implantation processes may also be performed to adjust threshold voltages of the core NMOS and PMOS devices in the other active regions of the substrate 101 as is known in the art.

Figure 4:
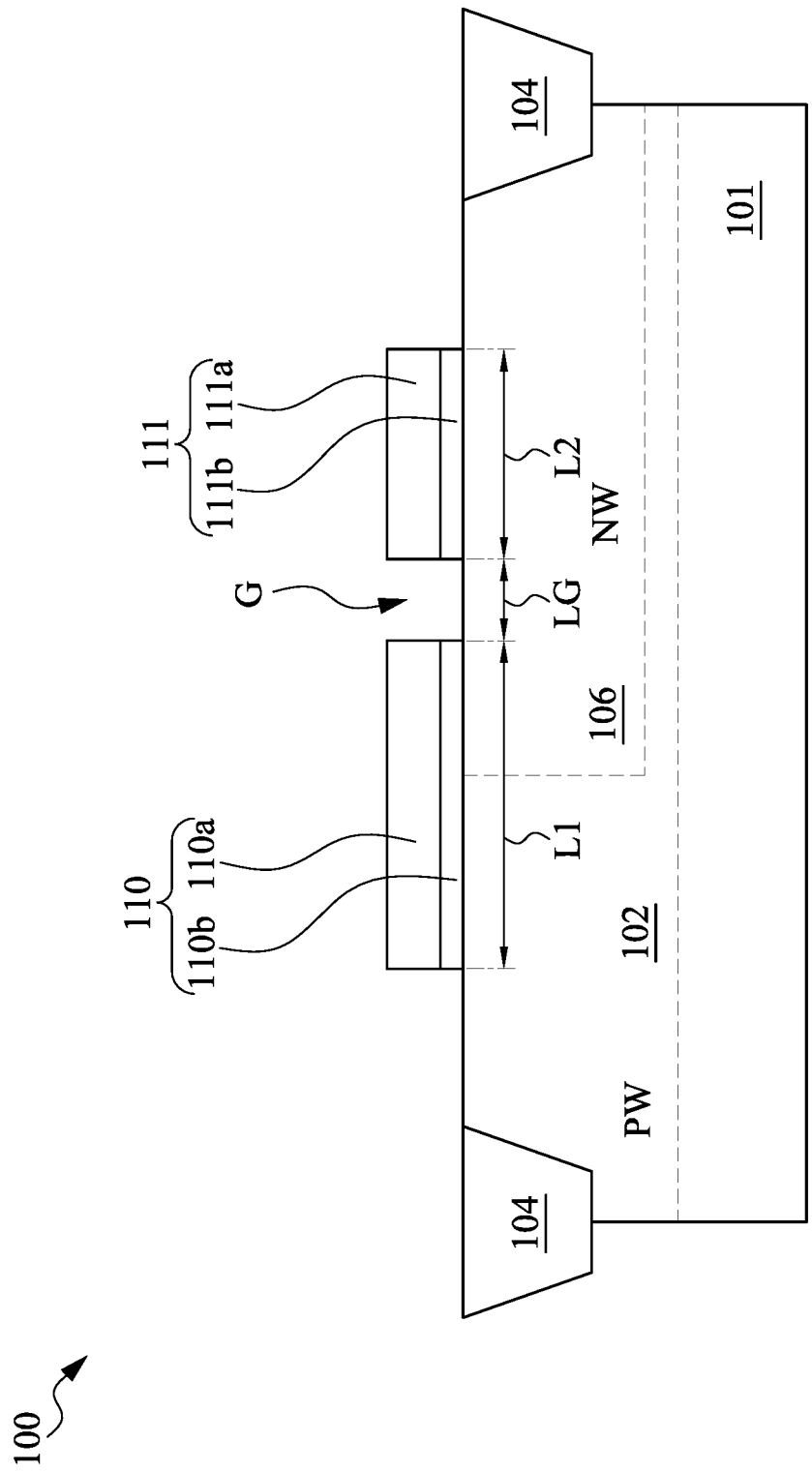

Referring to FIG. 4, a first gate structure 110 and a second gate structure 111 are formed and disposed over the semiconductor substrate 101. The second gate structure 111 is laterally adjacent to the first gate structure 110 and separated from the first gate structure 110 by a gap G. The first gate structure 110 and the second gate structure 111 can be electrically isolated from each other by the gap G. Thus, the length LG of the gap G should be sufficient to maintain the electrical isolation between the first gate structure 110 and the second gate structure 111. In some embodiments, the length LG of the gap G may be in a range from about 10 nanometers (nm) to about 250 nanometers (nm), for example, from about 20 nanometers (nm) to about 200 nanometers (nm). In some embodiments, the length LG of the gap G may be 10 nm, 20 nm, 40 nm, 60 nm, 80 nm, 100 nm, 125 nm, 150 nm, 175 nm, 200 nm, 225 nm or 250 nm.

Figure 6:
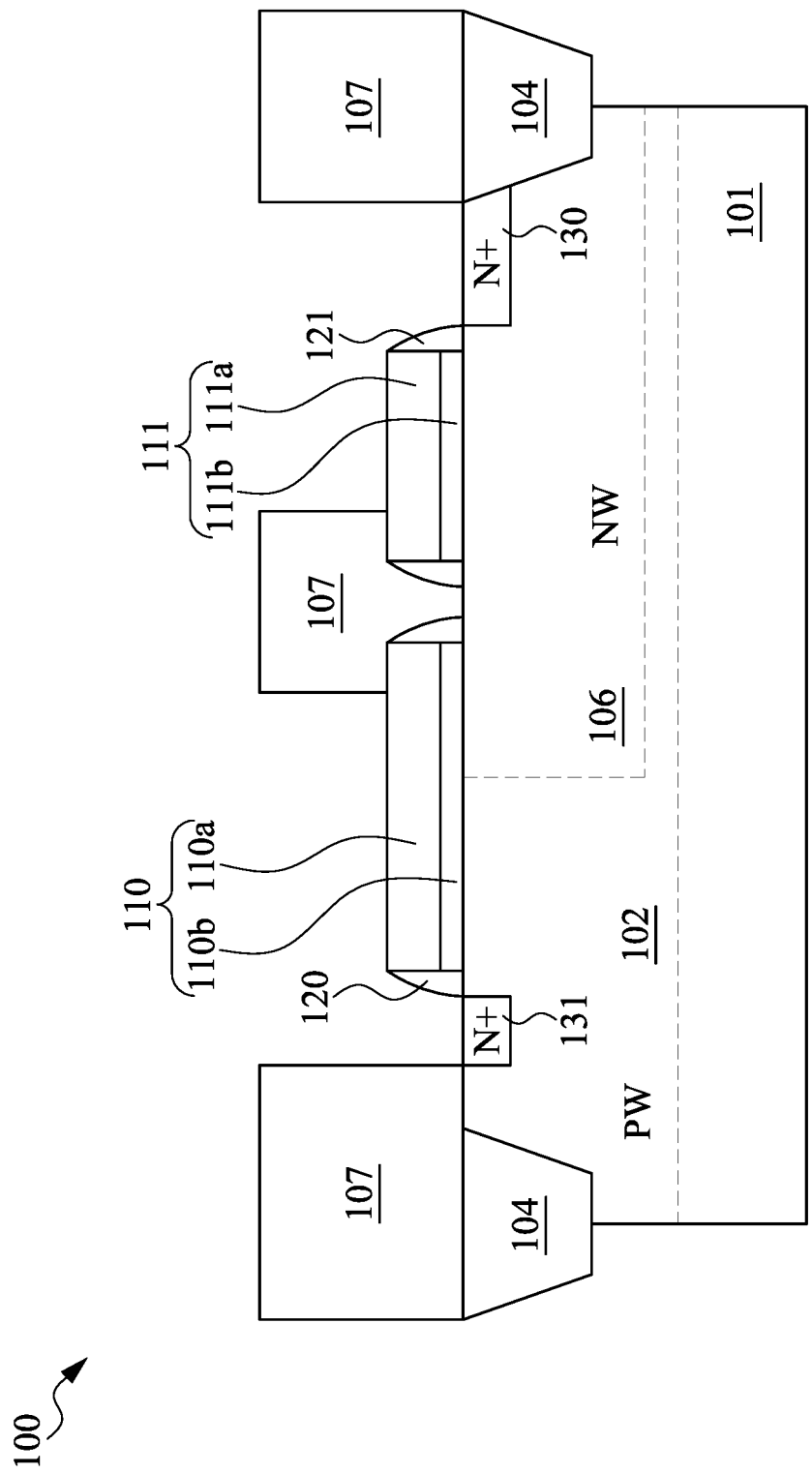

The first gate structure 110 is adjacent to the source region 131 depicted in FIG. 6. Further, the first gate structure 110 overlies a portion of the N-well 106 and a portion of the P-well 102. The second gate structure 111 is adjacent to the drain region 130 depicted in FIG. 6. Further, the second gate structure 111 overlies a portion of the N-well 106. In some embodiments, the second gate structure 111 does not cover the drain region 130.

In the present disclosure, the first gate structure 110 can be referred to as main gate and the second structure 111 can be referred to as split gate. In some embodiments, the length L1 of the first gate structure 110 may be in a range from about 0.1 micrometers (μm) to about 0.5 μm, e.g., 0.1 μm, 0.2 μm, 0.3 μm, 0.4 μm or 0.5 μm. In some embodiments, the length L2 of the second gate structure 111 may be in a range from about 0.04 μm to about 0.1 μm, e.g., 0.04 μm, 0.05 μm, 0.06 μm, 0.07 μm, 0.08 μm, 0.09 μm or 0.1 μm. In some embodiments, the length of the first gate structure is larger than or substantially the same as the length of the second gate structure. The length of the second gate structure 111 can be minimized as possible. In some embodiments, the second gate structure 111 may have a minimum length in accordance with the technology node.

The first gate structure 110 includes a gate dielectric layer 110b formed on the substrate 101, and a gate electrode 110a formed on the gate dielectric layer 110b. The second gate structure 111 includes a gate dielectric layer 111b formed on the substrate 101, and a gate electrode 111a formed on the gate dielectric layer 111b. In some embodiments, the second gate structure 111 may be formed in the same process as the first gate structure 110. In some embodiments, the first gate structure 110 and the second gate structure 111 may be formed as a large single gate structure first and a portion of the large single gate structure is then removed, e.g., by etching techniques, so as to reduce the gate to drain charge. As a result, the remaining portions of the large single gate structure become the first gate structure 110 and the second gate structure 111, respectively.

Since the second gate structure 111 is separated from the first gate structure 110 by a gap, the gate dielectric layer of the first gate structure 110 and the gate dielectric layer of the second gate structure 111 are discontinuous with each other. There is no electric field in the gap region, and thus, the hot carrier injection effect can be reduced. In addition, there is less oxide trapping and thus the reliability of the semiconductor device can be improved.

The first gate dielectric layer 110b may include a silicon oxide layer. Alternatively, the gate dielectric layer 110b may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric layer 110b may have a multilayer structure such as one layer of silicon oxide and another layer of high k material. The gate dielectric layer 110b may be formed using chemical vapor deposition (CVD), physical vapor deposition (PVD), atomic layer deposition (ALD), thermal oxide, other suitable processes, or combinations thereof. The gate dielectric layer 111b may be made of the same or different material as the gate dielectric layer 110b.

In some embodiments, a thickness of the gate dielectric layer 111b may the same as that of the gate dielectric layer 110b. In other embodiments, the gate dielectric layer 111b may be thinner or thicker than the gate dielectric layer 110b, i.e., the gate dielectric layer 111b may have a thickness smaller or greater than the thickness of the gate dielectric layer 110b.

The gate electrode 110a may include a doped polycrystalline silicon (or polysilicon). Alternatively, the gate electrode 110a may include a metal such as Al, Cu, W, Ti, Ta, TiN, TaN, NiSi, CoSi, other suitable conductive materials, or combinations thereof. The gate electrode 110a may be formed by CVD, PVD, plating, and other proper processes. The gate electrode 110a may have a multilayer structure and may be formed in a multi-step process using a combination of different processes. The gate electrode 111a may be made of the same or different material as the gate electrode 110a.

The gate electrode 110a disposed overlying the gate dielectric layer 110b may be configured to be coupled to metal interconnects which will be fabricated in subsequent operations. The gate electrode 111a disposed overlying the gate dielectric layer 111b is configured to be coupled to the drain region which will be fabricated in subsequent operations as discussed below with reference to FIG. 8.

Figure 5:
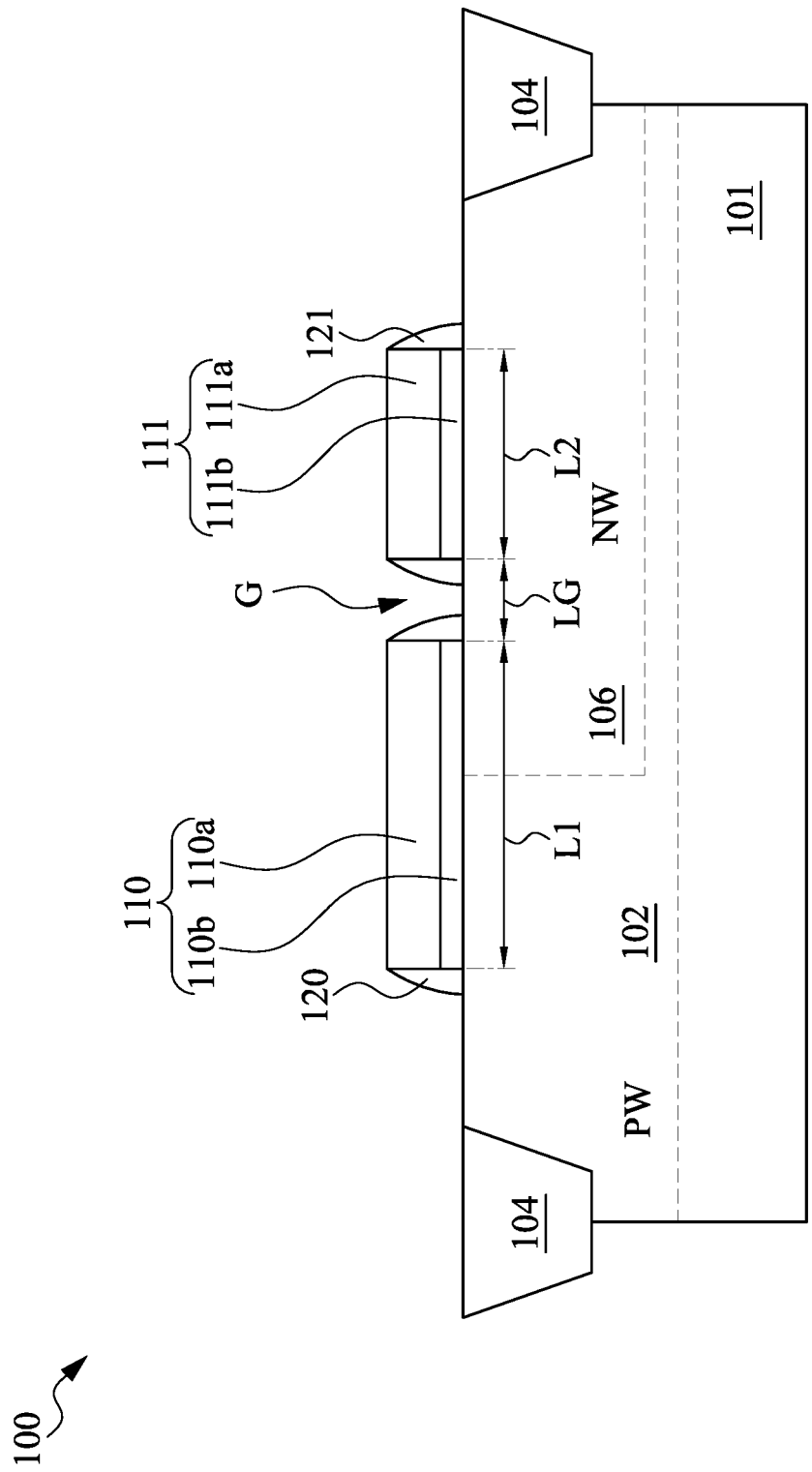

Referring to FIG. 5, sidewall spacers 120 are formed on the lateral surfaces of the first gate structure 110 and sidewall spacers 121 are formed on the lateral surfaces of the second gate structure 111. The sidewall spacers 120 and 121 may be made of the same or different material and may include a dielectric material such as silicon oxide. Alternatively, the sidewall spacers 120 and 121 may optionally include silicon nitride, silicon carbide, silicon oxynitride, or combinations thereof. In some embodiments, the sidewall spacers 120 and 121 may have a multilayer structure. The sidewall spacers 120 and 121 may be formed by a deposition process (such as CVD) and an anisotropic etching process (such as reactive-ion etching, RIE) as is known in the art. Each of the sidewall spacers 120 and 121 may independently have a thickness in a range from about 5 nm to 80 nm, e.g., 5 nm, 8 nm, 10 nm, 20 nm, 30 nm, 40 nm, 50 nm, 60 nm, 70 nm or 80 nm.

The gap between the first gate structure 110 and the second gate structure 111 is filled by the sidewall spacer 120 and the sidewall spacer 121. The sidewall spacer 120 and the sidewall spacer 121 cover a lateral surface of the first gate structure 110, a lateral surface of the second gate structure 111 and a top surface of the semiconductor substrate 101. In the embodiments illustrated in FIG. 5, the sidewall spacer 120 and the sidewall spacer 121 cover a portion of the top surface of the semiconductor substrate 101 in the gap (i.e., a portion of the top surface of the semiconductor substrate 101 is exposed from the gap). In some other embodiments, the sidewall spacer 120 and the sidewall spacer 121 cover the entire top surface of the semiconductor substrate 101.

Referring to FIG. 6, an ion implantation process is carried out to form the drain region 130 and the source region 131. A patterned photoresist layer 107 is disposed on the semiconductor 101 to define the regions for ion implantation. In the embodiments where a portion of the top surface of the semiconductor substrate 101 is exposed from the gap, the patterned photoresist layer 107 can be applied thereon prevent the semiconductor substrate 101 from ion implantation. In the embodiments where the gap is fully filled by the sidewall spaces, the sidewall space can prevent N+ or P+ ions from being implanted into the semiconductor substrate 101 to form a floating leakage path, and therefore, there is no need to dispose a photoresist layer thereon. In some embodiments, n-type dopants, such as phosphorus, arsenic, nitrogen, antimony, combination thereof, or the like are implanted into the semiconductor substrate 101 to form the drain region 130 and the source region 131. The drain region 130 and the source region 131 are n-type and can be referred to as N+ or heavily doped region. The drain region 130 is formed in the N-well 106 and adjacent to the second gate structure 111. The N-well 106 may act as a drift region. The source region 131 is formed in the P-well 102 and adjacent to the first gate structure 110. In some embodiments, the drain region 130 may include an edge substantially self-aligned to the sidewall spacer 121. In some embodiments, the source region 131 may include an edge substantially self-aligned to the sidewall spacer 120.

In various embodiments, the drain region 130 and the source region 131 may have different doping profiles formed by multi-process implantation. It should be noted that a process to form a source/drain of a p-type (referred to as P+ or heavily doped regions) may be performed for the PMOS devices in the other active regions of the substrate; accordingly, the NMOS devices including the present embodiment may be protected by a patterned photoresist layer.

Figure 7:
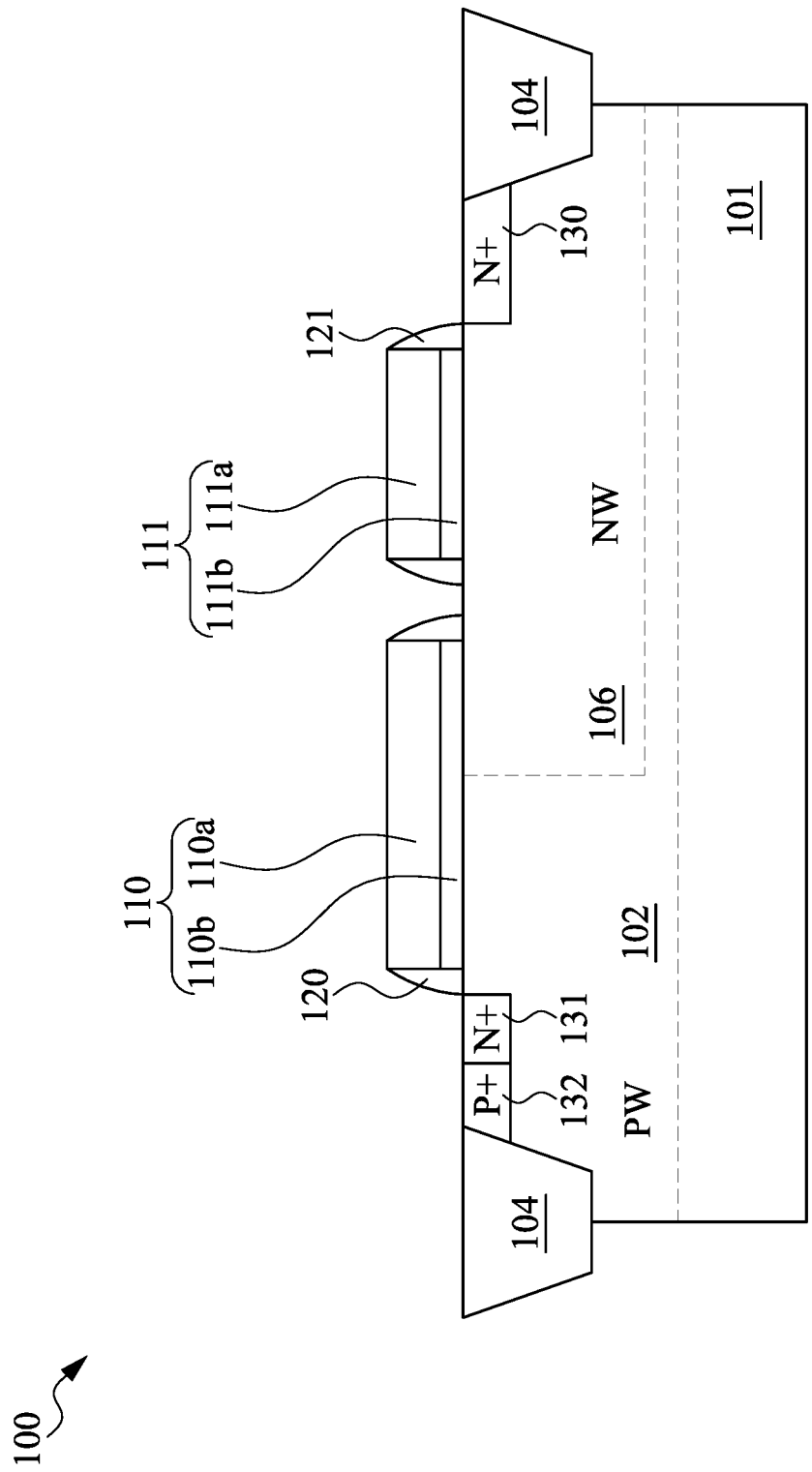

Referring to FIG. 7, an ion implantation process is carried out to form a p-type body contact region 132. The operations for forming the p-type body contact region 132 as illustrated in FIG. 7 are similar to that for forming the n-type drain region 130 and the n-type source region 131 as illustrated in FIG. 6. In the ion implantation process illustrated in FIG. 7 p-type dopants, such as boron, are used. The body contact region 132 is formed adjacent to the source region 131. The body contact region 132 may contact the P-well 102. The body contact region 132 may be coupled to the source region 131 by a source contact 140 formed in FIG. 8.

Figure 8:
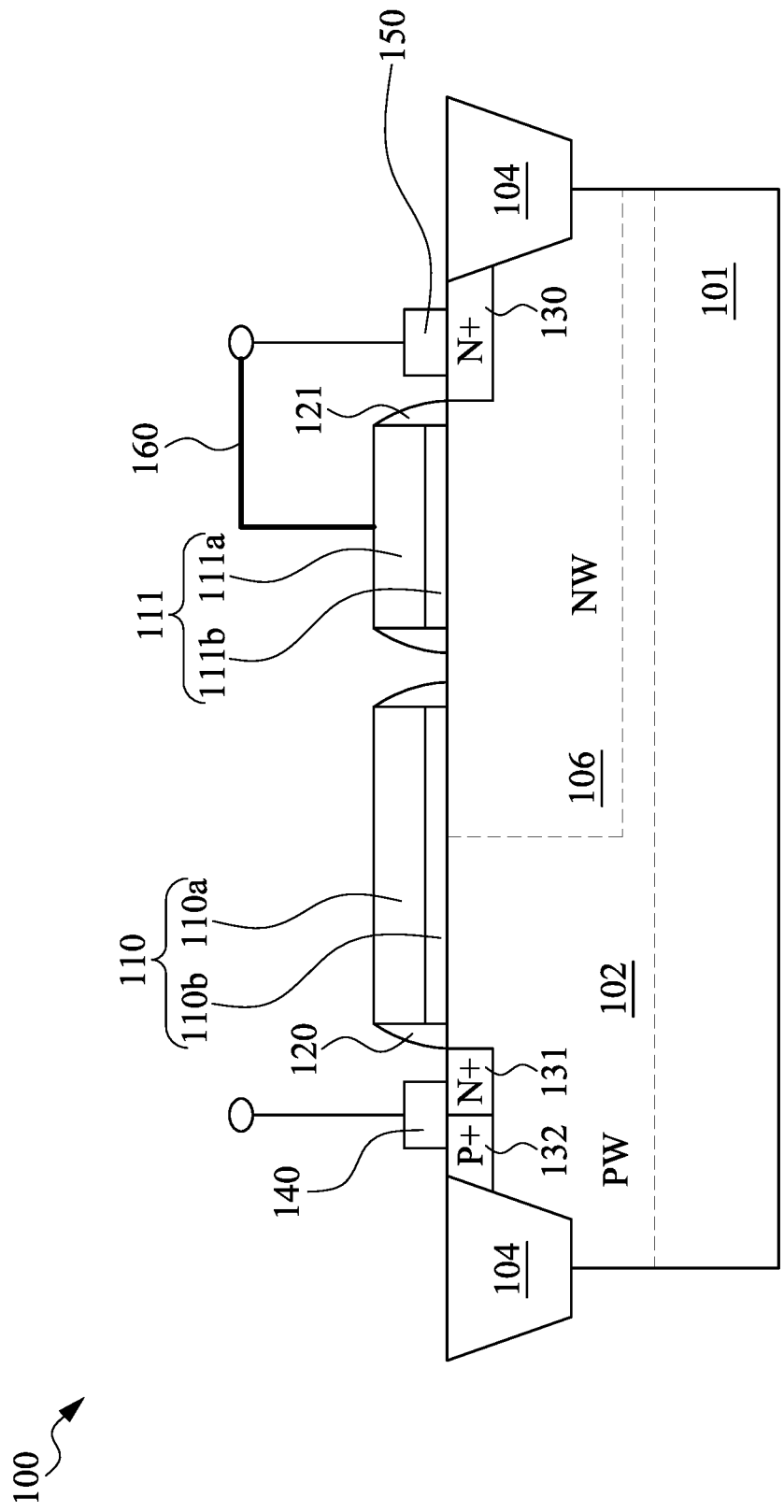

In some embodiments, various further CMOS processing operations can be carried out to further form contacts (e.g., source contact and drain contact) and/or metal features, etc., on the structure of FIG. 7. Referring to FIG. 8, in some embodiments, silicidation, such as salicide, is carried out to form a source contact 140 and a drain contact 150. A metal material, such as titanium, nickel, cobalt or combinations thereof, is applied on the drain region 130, the source region 131 and the body contact region 132, the temperature is raised to cause a reaction between the metal material and the underlying silicon of the drain region 130, the source region 131 and the body contact region 132 so as to form silicide, and the un-reacted metal material is removed (e.g., by etching). The silicide may be self-aligned to be formed on the drain region 130, the source region 131 and the body contact region 132 to reduce contact resistance. An annealing operation can be carried out so as to provide a desired crystalline phase to the silicide.

Although details are not showed in the drawings, subsequent processing can be carried out to form a plurality of patterned dielectric layers and conductive layers on the semiconductor substrate 101 in order to form interconnects which provide electrical connection to the source contact 140, the drain contact 150, the first gate structure 110 and the second gate structure 111. The conductive layers may include contacts, vias and metal lines and the dielectric layers are formed as interlayer dielectric (ILD) layers to separate and isolate one conductive layer from other conductive layers. In some embodiments, the materials for forming the conductive layers may include copper, copper alloy, aluminum, aluminum alloy, titanium, titanium nitride, tantalum, tantalum nitride, tungsten, polysilicon, metal silicide, or combinations thereof. Interconnects may be formed by a process including physical vapor deposition (or sputtering), chemical vapor deposition (CVD), combinations thereof, or other suitable processes. Other manufacturing techniques to form the interconnects may include photolithography processing and etching to pattern the conductive materials for vertical connections (vias and contacts) and horizontal connections (conductive lines). Alternatively, a copper multilayer interconnect may be used to form the metal patterns.

Referring back to FIG. 8, the second gate structure 111 is formed on the N-well (i.e., the drift region) 106 but does not cover the drain region 130. The second gate structure 111 is coupled to the drain, e.g., via interconnect 160. In some embodiments, the second gate structure 111 has an electrical potential substantially the same as an electrical potential of the drain region 130. In other words, the voltage drop in the semiconductor device 100 would appear from the first gate structure 110 to the second gate structure 111, and most of the voltage drop would appear in the gap. With the above structure, the gate-induced drain leakage (GIDL) can be improved and the drain-source breakdown voltage and (BVDSS) can be enhanced.

Figure 9:
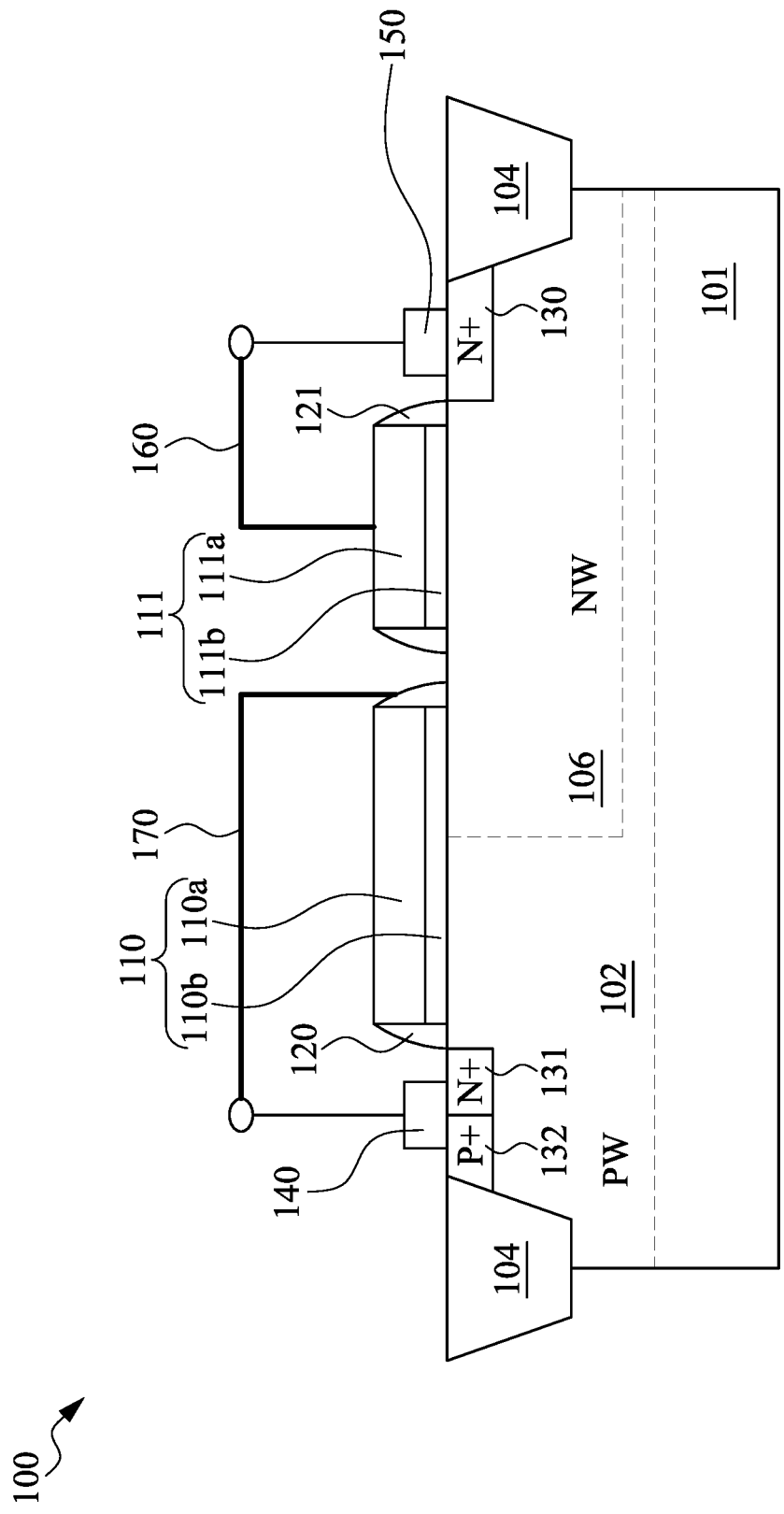
FIG. 9 illustrates a high voltage semiconductor device according to an exemplary embodiment of the present disclosure.

FIG. 9 illustrates a high voltage semiconductor device according to an exemplary embodiment of the present disclosure. In the embodiments, a contact field plate may be applied to the semiconductor device 100 to reduce undesirable leakage current. In FIG. 9, a contact field plate (field plate) 170 is formed above the first gate structure 110 and connected to the source. The contact field plate 170 may be electrically isolated from the first gate structure 110. In some embodiments, the contact field plate 170 may be connected to the source and the sidewall spacer 120 (which is formed in the gap and covers the lateral surface of the first gate electrode 110). It has been found that in such embodiments, the parasitic gate-to-drain capacitance (Cgd) can be reduced, and thus, fast switching characteristics can be achieved. Furthermore, the voltage or leakage current between the first gate electrode and the second gate electrode can be reduced, and thus, reliability can be improved.

Figure 10:
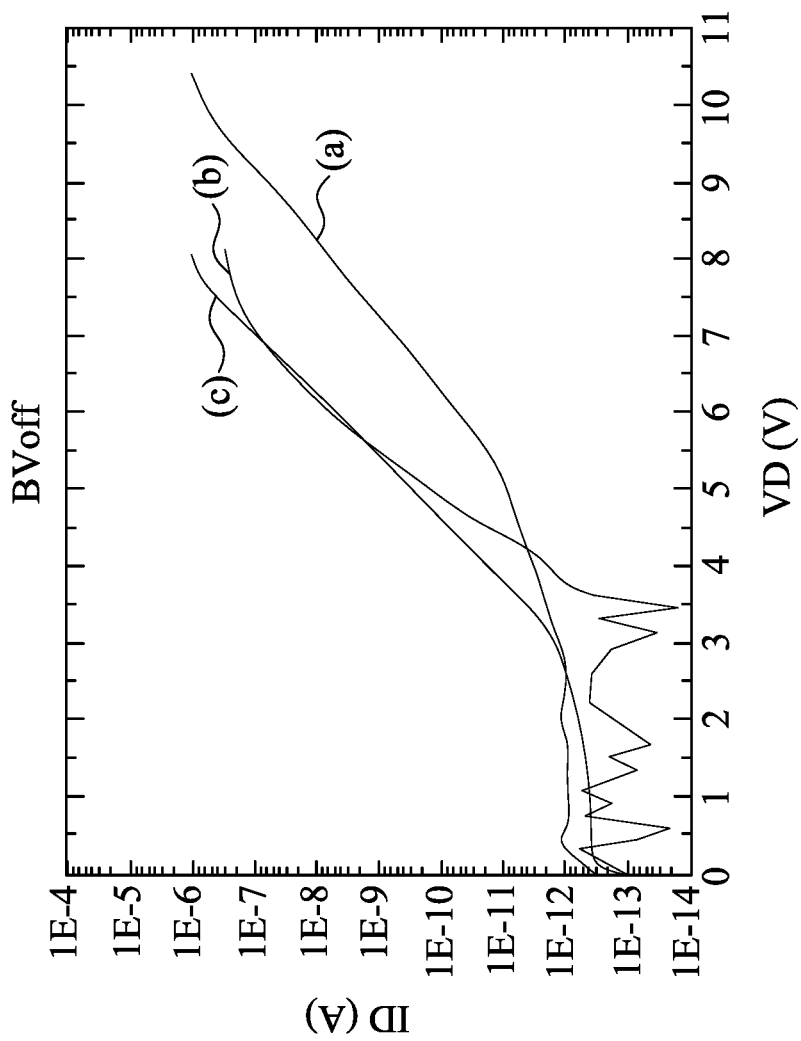
FIG. 10 illustrates the ID-VD characteristics of the semiconductor devices according to some embodiments of the present disclosure.

FIG. 10 illustrates the ID (Drain Current)-VD (Drain to source voltage) characteristics of the semiconductor devices according to some embodiments of the present disclosure. In FIG. 10, the ID-VD characteristics of the three semiconductor devices were recorded: (a) a semiconductor device as illustrated in FIG. 8 with a length of the gap between the first gate structure (main gate) and the second gate structure (split gate) being 0.08 μm; (b) a semiconductor device same as (a) except that the split gate is electrically coupled to the ground, not the drain region; and (c) a semiconductor device same as (a) except that the split gate is absent and the drain region is self-aligned to a sidewall space of the main gate. The result reveals that the semiconductor device having a split gate tied to ground exhibits an enhanced off-state breakdown voltage (BVoff).

Figure 11:
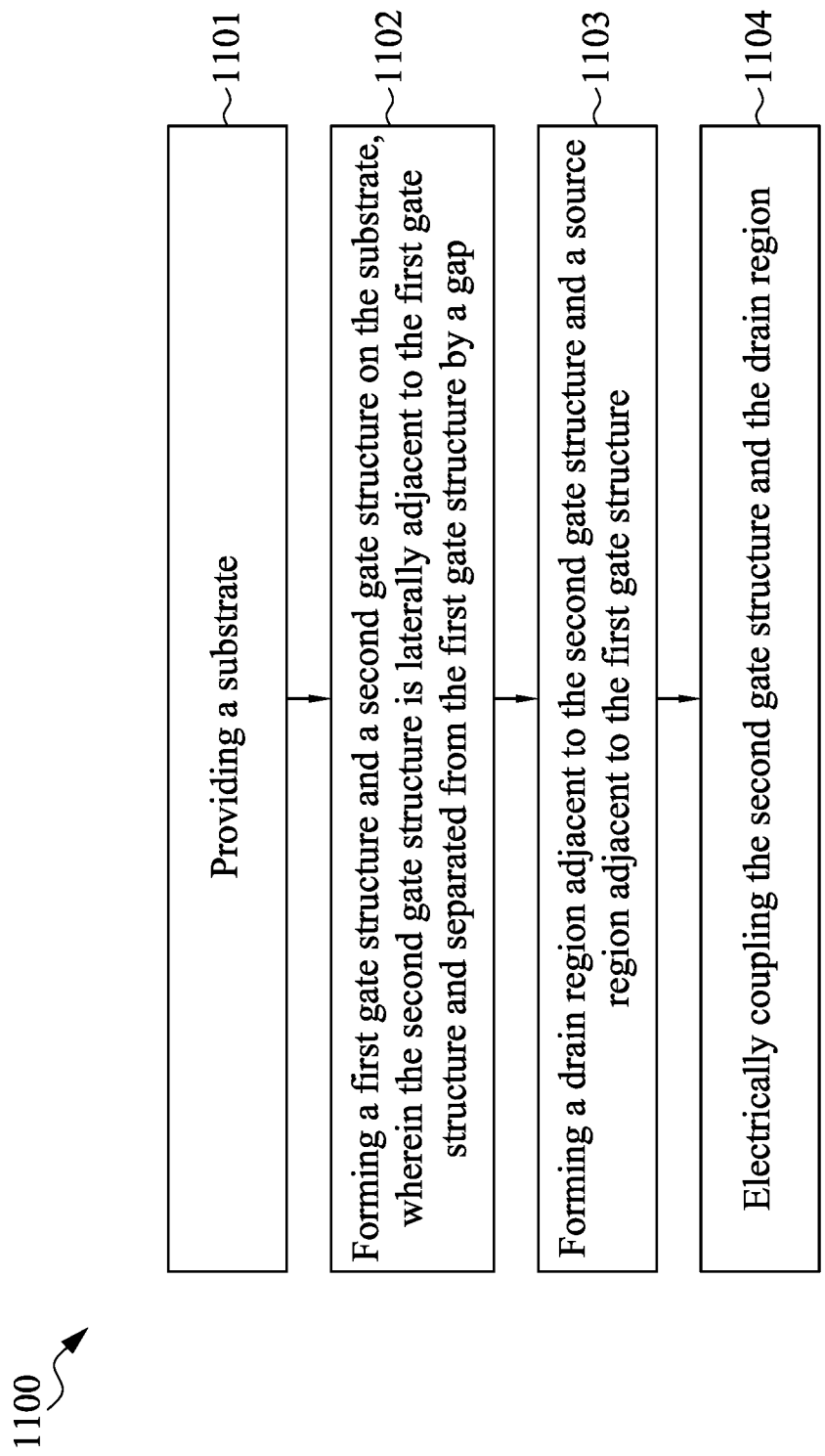
FIG. 11 shows a flowchart representing a method for forming a semiconductor device according to aspects of the present disclosure in one or more embodiments.

FIG. 11 illustrates a flowchart of a method 1100 for forming a semiconductor device in accordance with some embodiments of the present disclosure.

At operation 1101, a substrate 101 is provided and a P-well 102, a N-well 106, isolation feature structures 104 are formed in the substrate 101 as discussed above with reference to FIG. 1 to FIG. 3.

At operation 1102, a first gate structure 110 and a second gate structure 111 are formed on the substrate 101, the second gate structure 111 is laterally adjacent to the first gate structure 110 and separated from the first gate structure 110 by a gap as discussed above with reference to FIG. 4 and FIG. 5. Each of the first gate structure 110 and the second gate structure 111 has a gate dielectric layer (110b, 111b) between the substrate 101 and a gate electrode (110a, 111a). The gate dielectric layers 110b and 111b are spaced from each other. Sidewall spacers 120 and 121 are formed on the lateral surfaces of the first gate structure 110 and the second gate structure 111.

At operation 1103, a drain region 130 adjacent to the second gate structure 111 and a source region 131 adjacent to the first gate structure 110 are formed as discussed above with reference to FIG. 6. Further, a p-type body contact region 132 are formed as discussed above with reference to FIG. 7.

At operation 1104, the second gate structure 111 is electrically coupled to the drain region 130, e.g., via interconnect 160 as discussed above with reference to FIG. 8.

Accordingly, the present disclosure provides a semiconductor device, e.g., a MOSFET and a method for forming the same. The semiconductor device includes a first gate structure and a second gate structure, the second gate structure is adjacent to the drain region and electrically coupled to the drain region. The length of the second gate structure can be minimized depending on the technology node. The semiconductor device exhibits advantages including an enhanced breakdown voltage, a reduced gate-induced drain leakage, a reduced on-resistance (Ron) etc, can sustain a higher voltage and can be fabricated with a reduced device pitch. Furthermore, there is no specific limit to the thickness of the gate dielectric layers (e.g., gate oxide) and the self-alignment ion implantation can occur no matter the gate dielectric layer is thin or thick. Furthermore, the second gate structure may be formed in the same process as the first gate structure, and the gate dielectric layers (e.g., gate oxide) of the first and second gate structures may have the same thickness, and therefore, there is no need to carry out extra thermal process or use extra mask as compared to the existing techniques which use a stepped gate oxide layer or a plurality of gate oxide layers with additional thickness.

In some embodiments, a semiconductor device including a substrate, a source region, a drain region, a first gate structure and a second gate structure is provided. The source region and a drain region are formed in the substrate. The first gate structure is formed on the substrate and adjacent to the source region. The second gate structure is formed on the substrate and adjacent to the drain region. The second gate structure is electrically coupled to the drain region.

In some embodiments, a semiconductor device including a substrate, a source region, a drain region, a first gate structure, a second gate structure and a sidewall space is provided. The source region and drain region are formed in the substrate. The first gate structure and the second gate structure are formed on the substrate and between the source region and the drain region. The second gate structure has an electrical potential substantially the same as an electrical potential of the drain region.

In some embodiments, a method for forming a semiconductor device is provided. The method includes following operations. A substrate is provided. A first gate structure and a second gate structure are formed on the substrate and the second gate structure is laterally adjacent to the first gate structure and separated from the first gate structure by a gap. The second gate structure is electrically coupled to the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A semiconductor device, comprising:
a substrate;
a source region and a drain region formed in the substrate;
a first gate structure formed on the substrate and adjacent to the source region, wherein the first gate structure has a first gate electrode and a first gate dielectric layer between the substrate and the first gate electrode;
a second gate structure formed on the substrate and adjacent to the drain region wherein the second gate structure has a second gate electrode and a second gate dielectric layer between the substrate and the second gate electrode, wherein the second gate structure is electrically coupled to the drain region via an interconnect, and wherein the first gate dielectric layer and the second dielectric layer are spaced from each other, and
a field plate formed over the first gate structure in a direction perpendicular to the substrate.

2. The semiconductor device of claim 1, wherein the second gate dielectric layer has a thickness substantially the same as a thickness of the first gate dielectric layer.

3. The semiconductor device of claim 1, further comprising a drift region formed in the substrate, wherein the drain region is formed in the drift region and the second gate structure is formed on the first drift region and does not cover the drain region.

4. The semiconductor device of claim 1, wherein the first gate structure is separated from the second gate structure.

5. The semiconductor device of claim 4, wherein a gap between the first gate structure and the second gate structure has a length in a range from about 10 nanometers (nm) to about 250 nanometers (nm).

6. The semiconductor device of claim 5, wherein the gap is filled by a sidewall spacer.

7. The semiconductor device of claim 6, wherein the sidewall spacer is formed on a lateral surface of the first gate structure, a lateral surface of the second gate structure or both.

8. The semiconductor device of claim 6, wherein the gap is fully filled by the sidewall spacer.

9. The semiconductor device of claim 1, wherein a length of the first gate structure is larger than or substantially the same as a length of the second gate structure.

10. The semiconductor device of claim 1, wherein the field plate is electrically coupled to the source region.

11. The semiconductor device of claim 1, wherein the field plate is electrically isolated from the first gate structure.

12. A semiconductor device, comprising:
a substrate;
a source region and a drain region formed in the substrate;
a first gate structure and a second gate structure formed on the substrate and between the source region and the drain region; and
a field plate formed over the first gate structure in a direction perpendicular to the substrate,
wherein the second gate structure has an electrical potential substantially the same as an electrical potential of the drain region.

13. The semiconductor device of claim 12, wherein the second gate structure is electrically coupled to the drain region.

14. The semiconductor device of claim 12, wherein the second gate structure is adjacent to the drain region.

15. The semiconductor device of claim 12, wherein the drain region comprises an edge substantially self-aligned to a sidewall spacer formed on a lateral surface of the second gate structure.

16. The semiconductor device of claim 12, wherein the first gate structure comprises a first gate dielectric layer formed on the substrate and the second gate structure comprises a second gate dielectric layer formed on the substrate, and wherein the second gate dielectric layer has a thickness substantially the same as a thickness of the first gate dielectric layer.

17. The semiconductor device of claim 16, wherein a sidewall spacer formed on a lateral surface of the second gate structure comprises silicon nitride, silicon carbide, silicon oxynitride, or combinations thereof.

18. A method for forming a semiconductor device, comprising:
 providing a substrate;
 forming a first gate structure and a second gate structure on the substrate, wherein the second gate structure is laterally adjacent to the first gate structure and separated from the first gate structure by a gap;
 forming a drain region adjacent to the second gate structure and a source region adjacent to the first gate structure;
 forming a field plate over the first gate structure in a direction perpendicular to the substrate; and
 electrically coupling the second gate structure and the drain region via an interconnect.

19. The method for forming a semiconductor device of claim 18, further comprising forming a sidewall spacer on lateral surface of the second gate structure.

20. The semiconductor device of claim 7, wherein the field plate is connected to the source region and the sidewall spacer formed on a lateral surface of the first gate structure.

* * * * *